(12) United States Patent
Horiguchi et al.

(10) Patent No.: US 10,014,801 B2
(45) Date of Patent: Jul. 3, 2018

(54) PIEZOELECTRIC POWER GENERATION MODULE AND REMOTE CONTROLLER

(71) Applicant: Murata Manufacturing Co., Ltd., Nagaokakyo-shi, Kyoto-fu (JP)

(72) Inventors: Chikahiro Horiguchi, Nagaokakyo (JP); Kohei Takahashi, Nagaokakyo (JP)

(73) Assignee: MURATA MANUFACTURING CO., LTD., Nagaokakyo-Shi, Kyoto-Fu (JP)

( * ) Notice: Subject to any disclaimer, the term of this patent is extended or adjusted under 35 U.S.C. 154(b) by 218 days.

(21) Appl. No.: 15/202,946

(22) Filed: Jul. 6, 2016

(65) Prior Publication Data

US 2016/0315563 A1    Oct. 27, 2016

Related U.S. Application Data

(63) Continuation of application No. PCT/JP2014/077670, filed on Oct. 17, 2014.

(30) Foreign Application Priority Data

Jan. 22, 2014 (JP) .................................. 2014-009594

(51) Int. Cl.
　　*H01L 41/113*　　(2006.01)
　　*H02N 2/18*　　(2006.01)
　　*H01L 41/083*　　(2006.01)
　　*G08C 17/02*　　(2006.01)

(52) U.S. Cl.
CPC ............. *H02N 2/181* (2013.01); *G08C 17/02* (2013.01); *H01L 41/083* (2013.01); *H01L 41/1136* (2013.01); *G08C 2201/112* (2013.01); *H01L 41/1134* (2013.01)

(58) Field of Classification Search
CPC ................................ H02N 2/181; G08C 17/02
See application file for complete search history.

(56) References Cited

U.S. PATENT DOCUMENTS

| 7,005,780 B2 | 2/2006 | Sakai |
| 8,354,778 B2 * | 1/2013 | Arnold ................. H02K 7/1892 310/370 |
| 9,608,548 B2 * | 3/2017 | Tabata ................... H02N 2/181 |

(Continued)

FOREIGN PATENT DOCUMENTS

| EP | 2579440 A1 * | 4/2013 | ............. H02N 2/181 |
| JP | H07107752 A1 | 4/1995 | |

(Continued)

OTHER PUBLICATIONS

International Search Report issued for PCT/JP2014/077670, dated Jan. 13, 2015.

(Continued)

*Primary Examiner* — J. San Martin
(74) *Attorney, Agent, or Firm* — Arent Fox LLP

(57) ABSTRACT

A rectifier circuit rectifies power generation voltage of a piezoelectric element to generate DC voltage and supplies the power generation voltage to a load. Upon termination of a process started upon reception of the DC voltage supplied from the rectifier circuit, the load sets a discharge switch to a conduction state using an output port signal. The electric charge remaining in the piezoelectric element is reset to zero by the discharge switch.

20 Claims, 10 Drawing Sheets

(56) References Cited

U.S. PATENT DOCUMENTS

| | | | |
|---|---|---|---|
| 9,882,511 B2* | 1/2018 | Horiguchi | H02N 2/181 |
| 2004/0251789 A1 | 12/2004 | Sakai | |
| 2005/0253486 A1* | 11/2005 | Schmidt | H01L 41/1136 |
| | | | 310/329 |
| 2010/0079034 A1 | 4/2010 | Ramadass et al. | |
| 2010/0102782 A1 | 4/2010 | Thiesen et al. | |
| 2011/0227543 A1* | 9/2011 | Ivanov | H02M 7/219 |
| | | | 320/163 |
| 2014/0062256 A1* | 3/2014 | Buss | H02N 2/181 |
| | | | 310/319 |
| 2015/0303835 A1* | 10/2015 | Katsumura | H01L 41/1136 |
| | | | 310/329 |
| 2016/0156284 A1* | 6/2016 | Makihara | H02N 2/181 |
| | | | 310/318 |

FOREIGN PATENT DOCUMENTS

| | | | |
|---|---|---|---|
| JP | 2003007491 A | 1/2003 | |
| JP | 2010519891 A | 6/2010 | |
| WO | WO 03025969 A1 | 3/2003 | |

OTHER PUBLICATIONS

Written Opinion of the International Searching Authority issued for PCT/JP2014/077670, dated Jan. 13, 2015.

\* cited by examiner

PIEZOELECTRIC POWER GENERATION MODULE AND REMOTE CONTROLLER

CROSS REFERENCE TO RELATED APPLICATIONS

The present application is a continuation of PCT/JP2014/077670 filed Oct. 17, 2014, which claims priority to Japanese Patent Application No. 2014-009594, filed Jan. 22, 2014, the entire contents of each of which are incorporated herein by reference.

FIELD OF THE INVENTION

The present disclosure relates to a piezoelectric power generation module and a remote controller having the piezoelectric power generation module mounted therein. For example, the present disclosure relates to a piezoelectric power generation module that converts mechanical energy applied to a piezoelectric element into electrical energy and supplies power to a processing circuit and to a remote controller having the piezoelectric power generation module mounted therein.

BACKGROUND

Configurations to improve the power generation efficiency have been proposed for power supply apparatuses including piezoelectric elements that do not require batteries. For example, Patent Document 1 discloses a power generation apparatus including a power generation unit that generates power in response to application of strain to a piezoelectric element and a rectification unit that rectifies alternating-current (AC) voltage output from the power generation unit to output direct-current (DC) voltage. A configuration is disclosed in which the AC voltage generated by the piezoelectric element is rectified and smoothed with the rectification unit including a diode bridge and a smoothing capacitor and is converted into the DC voltage.

Patent Document 1: International Publication No. 2003/025969.

FIG. 7 and FIG. 8 illustrate a comparative example of the present disclosure. A piezoelectric power generation module 100R includes a piezoelectric element 1, a rectifier circuit 3, a smoothing capacitor 4, a load switch control circuit 5, a load switch 6, an output node N1, and an output node N2. A load 7 is connected between the output node N1 and the output node N2. In such a configuration in which electric charge generated by the piezoelectric element 1 is moved to the load 7 via the rectifier circuit 3, which is a full-wave rectifier circuit, the electric charge is capable of being supplied to a subsequent unit in both an operation to apply pressure to the piezoelectric element 1 and an operation to release the application of the pressure to the piezoelectric element 1. In other words, the electric charge generated by the piezoelectric element 1 is capable of being supplied to a subsequent unit at both positive voltage generated when the piezoelectric element 1 is deformed with respect to reference voltage in a state in which the piezoelectric element 1 is not deformed, and negative voltage generated when the piezoelectric element 1 is moved to the state in which the piezoelectric element 1 is not deformed with respect to reference voltage in a state in which the piezoelectric element 1 is deformed.

However, for example, in a system including a semiconductor integrated circuit as the load 7, when the voltage exceeds a certain threshold voltage in the deformation of the piezoelectric element 1, a high impedance state occurs when power generation voltage is lower than or equal to a minimum voltage at which the load 7 is capable of being normally driven and the voltage output from the piezoelectric element 1 is biased at a certain voltage. Accordingly, when the electric charge generated when the deformation of the piezoelectric element is returned to a normal state is to be continuously supplied to a subsequent unit, the power generation voltage is decreased. In addition, when the capacitance of the piezoelectric element 1 is made higher than that of the smoothing capacitor 4 in order to improve the power generation efficiency, the voltage does not reach the threshold voltage at which the load switch 6 is capable of operating in the worst case. Accordingly, there is a problem in that the piezoelectric power generation module is not capable of being stably driven in both the operation to apply pressure to the piezoelectric element and the operation to release the application of the pressure to the piezoelectric element.

SUMMARY OF INVENTION

The present disclosure provides a piezoelectric power generation module including a piezoelectric element including a first terminal and a second terminal; a discharge mechanism connected in parallel to the piezoelectric element; a rectifier circuit including an input terminal pair connected to the first terminal and the second terminal and an output terminal pair that outputs direct-current voltage; a switch control circuit including a first input terminal connected to one output terminal of the rectifier circuit, a second input terminal connected to the other output terminal of the rectifier circuit, and an output terminal that outputs a switch control signal; a capacitive element connected in parallel to the first input terminal and the second input terminal of the switch control circuit; and a first switch that is connected to the one output terminal of the rectifier circuit and that switches between a conduction state and a cut-off state in response to the switch control signal. After the first switch is set to the conduction state, the discharge mechanism is set to the conduction state.

With the above configuration, the discharge mechanism using the voltage at both ends of the piezoelectric element as reference voltage is provided in parallel to the piezoelectric element. The discharge mechanism is set to the conduction state before a state of application of pressure to the piezoelectric element is changed. Accordingly, the direct-current voltage is increased to a threshold voltage necessary for switching the first switch in both an operation to apply pressure to the piezoelectric element and an operation to release the application of pressure to the piezoelectric element. Consequently, it is possible to realize the piezoelectric power generation module capable of stable driving in both the operation to apply pressure to the piezoelectric element and the operation to release the application of pressure to the piezoelectric element.

The piezoelectric power generation module preferably includes a load provided downstream of the first switch. After a process by the load is terminated, the discharge mechanism is preferably set to the conduction state. With this configuration, the efficiency of the power generation is further improved.

An electrostatic capacity of the piezoelectric element is preferably greater than or equal to an electrostatic capacity of the capacitive element. With this configuration, since the amount of power generated through one operation is increased, the efficiency of the power generation is further improved.

The discharge mechanism is preferably a second switch.

The discharge mechanism preferably switches between the conduction state and the cut-off state using a control signal supplied from the load.

The piezoelectric power generation module preferably further includes a control circuit that output a control signal. The discharge mechanism preferably switches between the conduction state and the cut-off state using the control signal supplied from the control circuit on the basis of the conduction state of the first switch. With this configuration, it is possible to control the piezoelectric power generation module more efficiently.

The present disclosure provides a remote controller including the piezoelectric power generation module and a radio-frequency circuit. The radio-frequency circuit performs a process upon supply of the direct-current voltage from the first switch to the load. After the process is terminated, the discharge mechanism is set to the conduction state.

With the above configuration, the discharge mechanism using the voltage at both ends of the piezoelectric element as the reference voltage is provided in parallel to the piezoelectric element. The discharge mechanism is set to the conduction state before a state of application of pressure to the piezoelectric element is changed. Accordingly, the direct-current voltage is increased to a threshold voltage necessary for switching the first switch in both an operation to apply pressure to the piezoelectric element and an operation to release the application of pressure to the piezoelectric element. Consequently, it is possible to realize the remote controller capable of supplying necessary power generation voltage to the load capable of stable driving in both the operation to apply pressure to the piezoelectric element and the operation to release the application of pressure to the piezoelectric element.

According to the present disclosure, it is possible to provide a piezoelectric power generation module and the remote controller capable of stable driving when pressure is both applied to the piezoelectric element and released from the piezoelectric element.

DETAILED DESCRIPTION OF EMBODIMENTS

Figure 1:
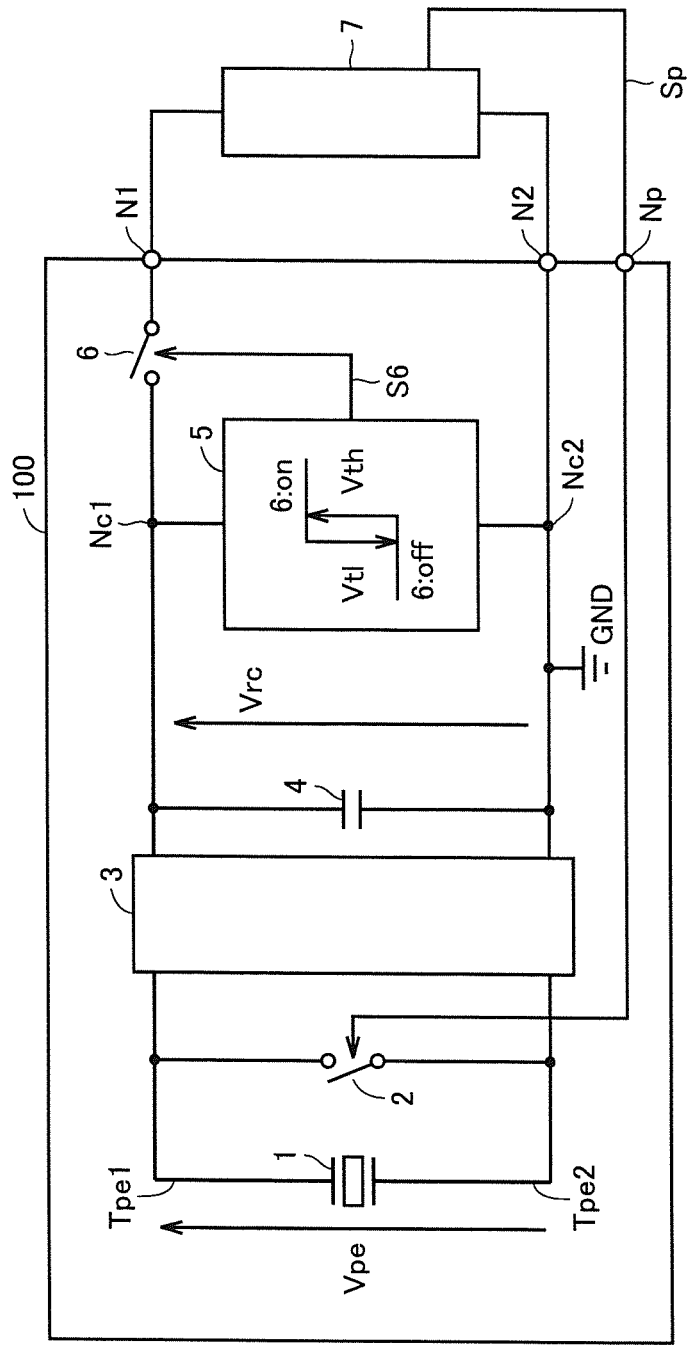
FIG. 1 is a circuit diagram of a piezoelectric power generation module according to a first embodiment.

Embodiments will herein be described with reference to the attached drawings. In the description of the embodiments, the number of pieces, the quantity, and so on that are referred to are not necessarily limited to those in the description unless otherwise specified. The same reference symbols and numerals are used to identify the same components or similar components in the drawings of the embodiments. A duplicated description may not be repeated for the components and so on to which the same reference symbols and the likes are added in the description of the embodiments.

First Embodiment

FIG. 1 is a circuit diagram of a piezoelectric power generation module 100 according to a first embodiment. The terms piezoelectric power generation module and piezoelectric power generation device are used interchangeably herein.

The piezoelectric power generation module 100 includes a piezoelectric element 1, a discharge switch 2, a rectifier circuit 3, a smoothing capacitor 4, a load switch control circuit 5, a load switch 6, an output node N1, an output node N2, and an input node Np.

A load 7 is connected between the output node N1 and the output node N2. According to an exemplary embodiment, the load 7 can be connected the output nodes N1 and N2 by conductive wiring, for example, and preferably can be connected and disconnected as a removable connector. According to an exemplary embodiment, the load 7 is, for example, a radio-frequency (RF) circuit or a processing circuit such as a microcomputer. Power supply voltage is supplied to such a processing circuit from the output node N1 and the output node N2 of the piezoelectric power generation module 100 and the processing circuit outputs a signal (an identification code identifier (ID) or the like) to control an electronic device that is not connected to the piezoelectric power generation module 100. Accordingly, the connection of the load 7 to the piezoelectric power generation module 100 provides a remote controller or a wireless switch. The discharge switch 2 corresponds to a discharge mechanism in the present disclosure. The smoothing capacitor 4 corresponds to a capacitive element in the present disclosure. The load switch control circuit 5 corresponds to a switch control circuit in the present disclosure. The load switch 6 corresponds to a first switch in the present disclosure.

FIGS. 2(*a*)-2(*c*) illustrate cross-sectional views of the relationship between a state of application of pressure to the piezoelectric element 1 in the piezoelectric power generation module 100 according to the first embodiment and electric charge that is generated. It should be appreciated that the piezoelectric power generation module 100 can be a handheld device used by a user, for example. Thus, in one embodiment, the application of pressure can be as a result of a push-button switch pushed by user, for example. Thus, pushing and releasing of a push-button switch would result in deformation that generates the voltage according to an exemplary embodiment.

Figure 2A:
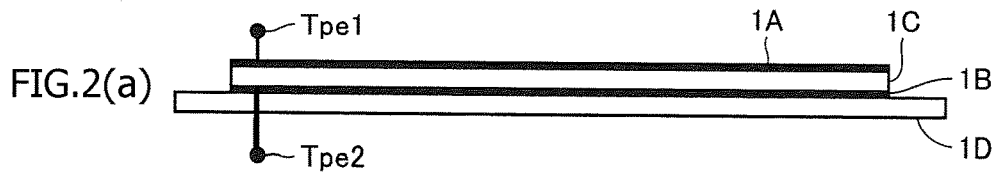
FIGS. 2(*a*)-2(*c*) illustrate cross-sectional views of the relationship between a state of application of pressure to a piezoelectric element in the piezoelectric power generation module according to the first embodiment and electric charge that is generated.
Figure 2B:
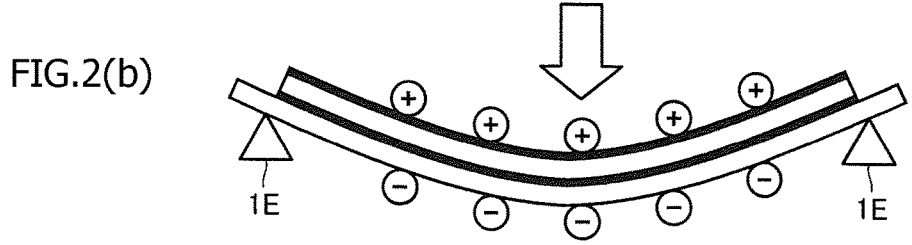

FIG. 2(a) is a cross-sectional view schematically illustrating a state of the piezoelectric element 1 when no stress is applied. The piezoelectric element 1 includes a piezoelectric body 1C and a metal plate 1D. The piezoelectric body 1C has a planar shape and is made of, for example, lead zirconate titanate (PZT) ceramics. An electrode 1A is provided on one main face of the piezoelectric body 1C and an electrode 1B is provided on the other main face thereof. In the piezoelectric element 1, the metal plate 1D is electrically connected to the piezoelectric body 1C via the electrode 1B. The electrode 1A is connected to a first signal line Tpe1 and the metal plate 1D is connected to a second signal line Tpe2. As illustrated in FIG. 2(b), both ends of the piezoelectric element 1 are supported by supports 1E. The piezoelectric element 1 is polarized in response to stress applied in an arrow direction in FIG. 2(b). The electrode 1A corresponds to a first terminal of the piezoelectric element in the present disclosure. The electrode 1B corresponds to a second terminal of the piezoelectric element in the present disclosure.

FIG. 2(b) schematically illustrates a cross-sectional view of the piezoelectric element 1 in a state in which load is applied. Upon application of pressure (application of stress) to a central portion of the piezoelectric element 1, mechanical energy is converted into electrical energy. FIG. 2(b) illustrates how the piezoelectric body 1C in the piezoelectric element 1 is polarized due to deformation caused by the application of the pressure to cause the electrode 1A connected to the first signal line Tpe1 to be positively charged and cause the electrode 1B connected to the second signal line Tpe2 to be negatively charged. It is noted that the negative charge is illustrated below the metal plate 1D, but corresponds to the charge of the electrode 1B.

Figure 2C:
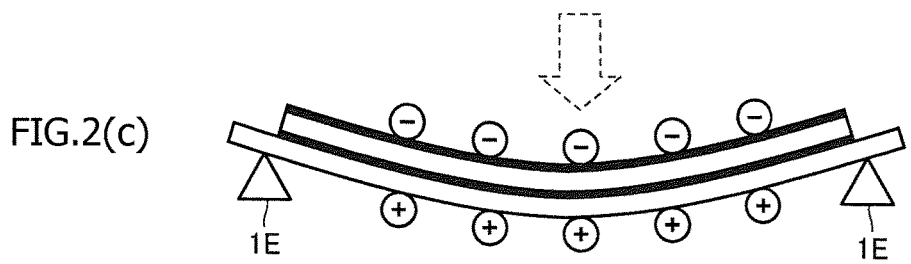

FIG. 2(c) illustrates a state in which the state in FIG. 2(b) returns to the state in FIG. 2(a) while the application of pressure to the piezoelectric element 1 is being released, that is, in response to release of the stress applied to the piezoelectric element 1. Specifically, in the state illustrated in FIG. 2(c), the electrode 1A of the piezoelectric body 1C, which is connected to the first signal line Tpe1, is negatively charged and the electrode 1B of the piezoelectric body 1C, which is connected to the second signal line Tpe2, is positively charged in the piezoelectric element 1 the application of pressure to which is being released. It is noted that the positive charge is illustrated below the metal plate 1D, but corresponds to the charge of the electrode 1B.

When pressure is applied (upon application of stress) to the piezoelectric element 1, the voltage of the first signal line Tpe1 is increased relative to the second signal line Tpe2. Power generation voltage Vpe is generated in the first signal line Tpe1. The power generation voltage Vpe generated while pressure is being applied to the piezoelectric element 1 may be hereinafter described as "the positive power generation voltage Vpe". In contrast, when pressure on the piezoelectric element 1 is released (the stress is released), the voltage of first signal line Tpe1 is decreased relative to the second signal line Tpe2. The power generation voltage Vpe is generated in the second signal line Tpe2. The power generation voltage Vpe generated while the application of pressure is being released may be hereinafter described as "the negative power generation voltage Vpe". In other words, AC voltage is generated between the first signal line Tpe1 and the second signal line Tpe2 in response to application of pressure to the piezoelectric element 1 and release of the pressure to the piezoelectric element 1.

The discharge switch 2 in FIG. 1 is connected in parallel to the piezoelectric element 1 and the conduction state of the discharge switch 2 is controlled by an output port signal Sp supplied to the input node Np. Preferably, the discharge switch 2 is an electronic switch.

According to the exemplary embodiment, the rectifier circuit 3 is a general full-wave rectifier circuit including a diode bridge. One terminal of an input terminal pair of the rectifier circuit 3 is connected to the first signal line Tpe1 and the other terminal of the input terminal pair thereof is connected to the second signal line Tpe2. The smoothing capacitor 4 is connected between the terminals of an output terminal pair of the rectifier circuit 3. The power generation voltage Vpe applied to the input terminal pair of the rectifier circuit 3 is subjected to full-wave rectification in the diode bridge, is subjected to smoothing in the smoothing capacitor 4, and is converted into direct current (DC) voltage Vrc. The DC voltage is output from the output terminal pair of the rectifier circuit 3. In the output terminal pair of the rectifier circuit 3, the terminal at the low voltage side is set to GND.

As shown, a power supply node Nc1 of the load switch control circuit 5 is connected to the terminal at the high voltage side of the output terminal pair of the rectifier circuit 3 and a power supply node Nc2 of the load switch control circuit 5 is connected to the terminal at the low voltage side of the output terminal pair of the rectifier circuit 3. The power supply node Nc2 is connected to the output node N2. The load switch control circuit 5 outputs a load switch control signal S6 from an output terminal to switch the load switch 6 between the conduction state and a cut-off state.

The ends of the load switch 6 are connected to the power supply node Nc1 of the load switch control circuit 5 and the output node N1, respectively. The load switch 6 may be arranged between the power supply node Nc2 and the output node N2, instead of the arrangement of the load switch 6 between the power supply node Nc1 and the output node N1 as shown in FIG. 1.

Figure 4:
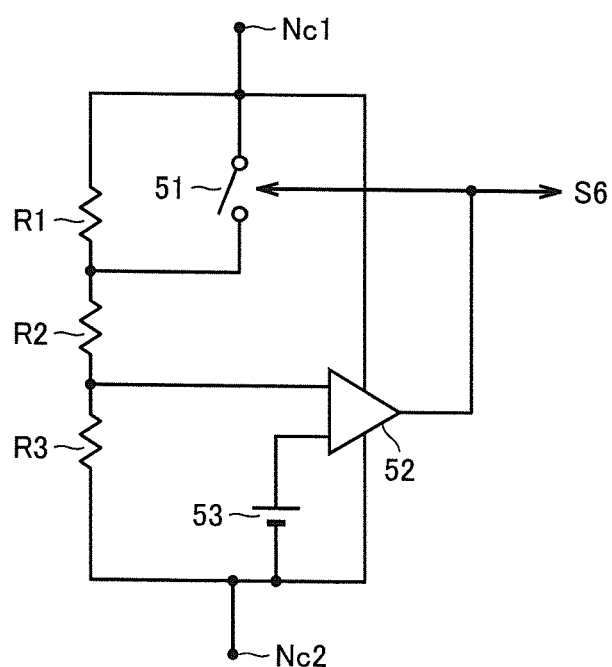
FIG. 4 is a circuit diagram of a load switch control circuit in the piezoelectric element according to the first embodiment.

FIG. 4 is a circuit diagram of the load switch control circuit 5 in the piezoelectric power generation module 100 in FIG. 1.

The load switch control circuit 5 is composed of, for example, a complementary metal oxide semiconductor (CMOS) circuit. The load switch control circuit 5 has a first input terminal connected to the power supply node Nc1, a second input terminal connected to the power supply node Nc2, and an output terminal. The load switch control circuit 5 includes a resistor R1, a resistor R2, and a resistor R3 connected in series between the power supply node Nc1 and the power supply node Nc2. In addition, the load switch control circuit 5 includes a switch 51, a comparison voltage generating circuit 53, and a comparator circuit 52. The switch 51 is, for example, an electronic switch. The comparison voltage generating circuit 53 is, for example, a band gap reference. The comparator circuit 52 is, for example, an operational amplifier.

One end of the resistor R1 is connected to the power supply node Nc1 and the other end thereof is connected to one end of the resistor R2. The one end of the resistor R2 is connected to the other end of the resistor R1 and the other end thereof is connected to one end of the resistor R3. The one end of the resistor R3 is connected to the other end of the resistor R2 and the other end thereof is connected to the power supply node Nc2. One end of the switch 51 is connected to the power supply node Nc1 and the other end thereof is connected to the other end of the resistor R1. An input terminal of the comparison voltage generating circuit 53 is connected to the power supply node Nc2 and an output terminal thereof is connected to an inverting input terminal of the comparator circuit 52. A non-inverting input terminal of the comparator circuit 52 is connected to the one end of the resistor R3 and an output terminal thereof is connected to the switch 51 and the load switch 6.

The load switch control circuit 5 varies a logical level of the load switch control signal S6 to be output depending on variation in the DC voltage Vrc applied between the power supply node Nc1 and the power supply node Nc2. The load switch 6 is set to the conduction state (on state) when the logical level of the load switch control signal S6 is set to a high level and is set to the cut-off state (off state) when the logical level of the load switch control signal S6 is set to a low level.

When the load switch 6 is set to the conduction state, the DC voltage Vrc generated between the output node N1 and the output node N2 is supplied to the load 7. The amount of electric charge accumulated in the smoothing capacitor 4 is gradually decreased in accordance with current consumption in the load 7 to decrease the value of the DC voltage Vrc. The voltage of the second signal line Tpe2 in a state in which the piezoelectric element 1 is not deformed corresponds to reference voltage GND in the present disclosure.

The load switch control circuit 5 is set so that the variation in the logical level of the load switch control signal S6 to be output from the load switch control circuit 5 has hysteresis characteristics with respect to the variation in the DC voltage Vrc input between the power supply node Nc1 and the power supply node Nc2. The hysteresis characteristics are realized by switching the conduction state of the switch 51 using the load switch control signal S6 output from the comparator circuit 52.

When the value of the DC voltage Vrc is increased from zero to a threshold voltage Vth, the load switch 6 is varied from the off state to the on state. Then, when the value of the DC voltage Vrc is decreased to a threshold voltage Vtl lower than the threshold voltage Vth in association with the supply of current to the load 7, the load switch 6 is varied from the conduction state to the cut-off state.

When the switch 51 is in the cut-off state, the DC voltage Vrc will be divided among the resistors R1, R2, and R3 connected in series between the power supply node Nc1 and the power supply node Nc2. The comparator circuit 52 compares the voltage between both ends of the resistor R3 and the voltage generated by the comparison voltage generating circuit 53 to determine the logical level of the load switch control signal S6. According to the exemplary embodiment, the designer/manufacturer can set the values of the resistors R1 to R3 and the value of the comparison voltage so that the threshold voltage Vth (refer to FIG. 1) has a desired value. When the value of the DC voltage Vrc exceeds the threshold voltage Vth, the comparator circuit 52 varies the logical level of the load switch control signal S6 from the low level to the high level. The load switch 6 is set to the conduction state in response to the variation in the load switch control signal S6 and the DC voltage Vrc is applied between the output node N1 and the output node N2 (refer to FIG. 1).

When the load switch control signal S6 is set to the high level, the switch 51 connected in parallel to the resistor R1 is also set to the conduction state and the voltage of the power supply node Nc1 (the DC voltage Vrc) is divided between the resistor R2 and the resistor R3. Since the value of the voltage between both ends of the resistor R3 is increased, compared with the case in which the switch 51 is in the cut-off state, the comparator circuit 52 varies the logical level of the load switch control signal S6 from the high level to the low level when the value the DC voltage Vrc reaches the threshold voltage Vtl lower than the threshold voltage Vth. The load switch 6 is set to the cut-off state in response to the variation in the load switch control signal S6 and the supply of the DC voltage Vrc to the output node N1 is stopped.

Figure 5:
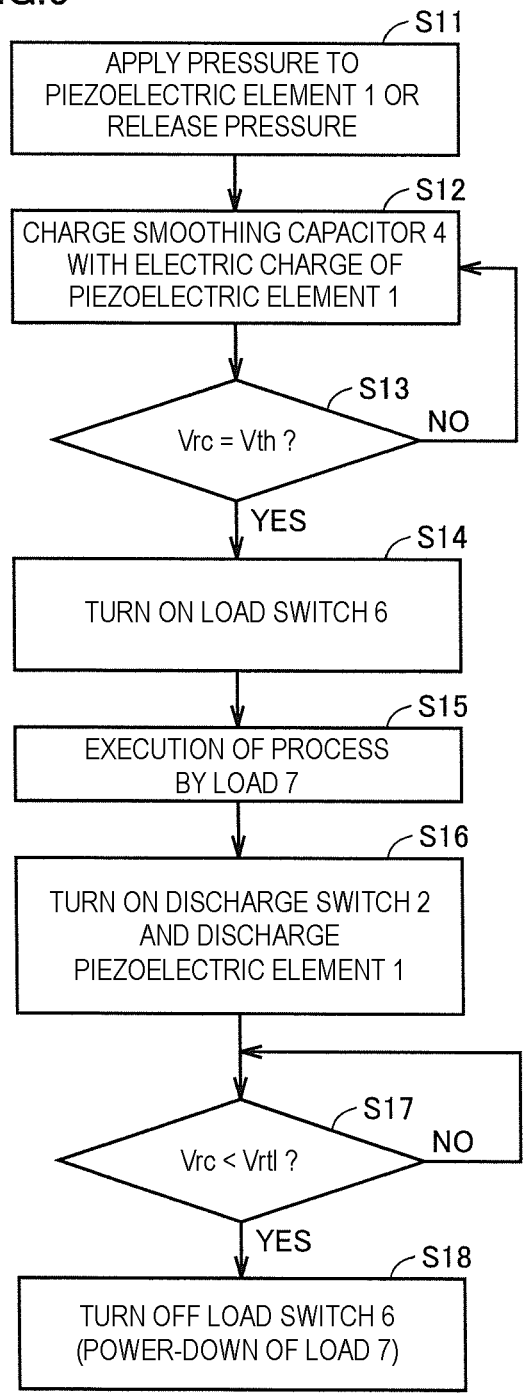
FIG. 5 is a flowchart illustrating a processing flow of the piezoelectric power generation module according to the first embodiment.

FIG. 5 is a flowchart illustrating a processing flow of the piezoelectric power generation module 100 in FIG. 1.

The processing flow of the piezoelectric power generation module 100 will now be described with reference to FIG. 5 and FIG. 1.

Upon application of pressure to the piezoelectric element 1 (upon generation of the positive power generation voltage Vpe) or upon release of application of pressure to the piezoelectric element 1 (upon generation of the negative power generation voltage Vpe), the power generation voltage Vpe is applied between the terminals of the input terminal pair of the rectifier circuit 3 (Step S11). The power generation voltage Vpe rectified by the rectifier circuit 3 is smoothed by the smoothing capacitor 4 to generate the DC voltage Vrc (Step S12). The load switch control circuit 5 determines whether the value of the DC voltage Vrc that is applied reaches the threshold voltage Vth (Step S13).

If the value of the DC voltage Vrc is lower than the threshold voltage Vth ("NO" in Step S13), the load switch 6 is set to the cut-off state and the rectifier circuit 3 continuously charges the smoothing capacitor 4. If the value of the DC voltage Vrc reaches the threshold voltage Vth ("YES" in Step S13), the load switch control circuit 5 sets the load switch 6 to the conduction state using the load switch control signal S6 (Step S14).

The DC voltage Vrc is supplied to the load 7 via the load switch 6 and the output node N1. The load 7 performs a signal transmission process to an electronic device (Step S15). Then, the load 7 supplies the output port signal Sp to the input node Np. The discharge switch 2 is set to the conduction state in response to the output port signal Sp and a short circuit is made between the first signal line Tpe1 the second signal line Tpe2. The electric charge accumulated in the piezoelectric element 1 at this time is discharged and the value of the power generation voltage Vpe is set to zero (Step S16).

The load switch control circuit 5 compares the value of the DC voltage Vrc that is applied with the threshold voltage Vtl (Step S17). If the value of the DC voltage Vrc is higher than or equal to the threshold voltage Vtl ("NO" in Step S17), the load switch 6 remains in the conductive state. If the value of the DC voltage Vrc is lower than the threshold voltage Vtl ("YES" in Step S17), the load switch control circuit 5 sets the load switch 6 to the cut-off state using the load switch control signal S6 (Step S18). Upon setting of the load switch 6 to the cut-off state, the supply of the DC voltage Vrc to the load 7 is stopped and the load 7 is powered down.

Figure 6:
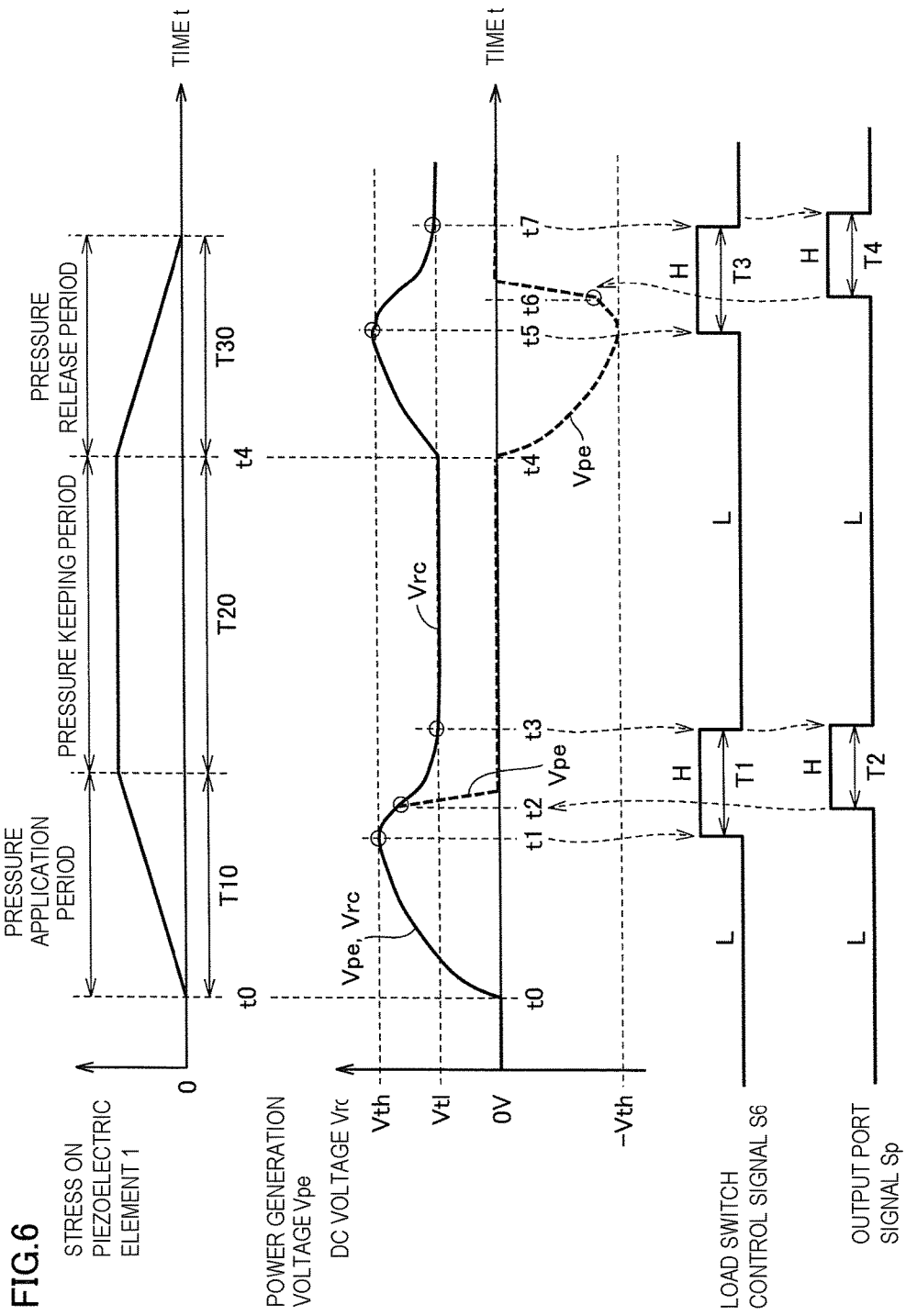
FIG. 6 is a timing chart describing an operation of the piezoelectric power generation module according to the first embodiment.

FIG. 6 is a timing chart describing an operation of the piezoelectric power generation module 100 in FIG. 1.

The operation of the piezoelectric power generation module 100 will now be described with reference to FIG. 6 and FIG. 1. Referring to FIG. 6, the horizontal axis represents time and the vertical axis schematically represents voltage waveforms including the power generation voltage Vpe and signal waveforms. The operation of the piezoelectric power generation module 100 illustrated in FIG. 6 is divided into operations in three continuous periods: 1) application of pressure to the piezoelectric element 1 during a pressure application period T10, 2) maintaining pressure on the piezoelectric element 1 during a pressure maintaining period T20, and 3) release of the application of the pressure to the piezoelectric element 1 during a pressure release period T30.

(Pressure Application Period T10)

At start of application of pressure to the piezoelectric element 1 at a time t0, the DC voltage Vrc output from the rectifier circuit 3 is also increased with the increase in the power generation voltage Vpe generated by the piezoelectric element 1. During the pressure application period to the piezoelectric element 1, which is started at the time t0, the piezoelectric element 1 outputs the positive power generation voltage Vpe. The values of the power generation voltage Vpe and the DC voltage Vrc reach the threshold voltage Vth at a time t1. When the value of the DC voltage Vrc reaches the threshold voltage Vth, the load switch control circuit 5 varies the logical level of the load switch control signal S6 from a low level L to a high level H. In response to the variation in the load switch control signal S6, the load switch 6 is set to the conduction state and the piezoelectric power generation module 100 starts supply of the DC voltage Vrc to the load 7.

After the time t1, the load 7 consumes the electric charge accumulated in the smoothing capacitor 4 to perform a certain process (the signal transmission process to an electronic device) and terminates the process by a time t2. After the time t2, the load 7 keeps an idle state. When the value of the DC voltage Vrc reaches the threshold voltage Vtl at a time t3, the load switch control circuit 5 varies the load switch control signal S6 to the low level L to set the load switch 6 to the cut-off state and stops the supply of the DC voltage Vrc to the load 7.

In contrast, the power generation voltage Vpe is varied in the following manner. Upon completion of the signal transmission process started at the time t1 at the time t2, the load 7 supplies the output port signal Sp to the input node Np. The discharge switch 2 is varied from the cut-off state to the conduction state in response to the output port signal Sp. A short circuit is made between the first signal line Tpe1 and the second signal line Tpe2 and the electric charge accumulated in the piezoelectric element 1 at this time is discharged. After the time t2, the value of the power generation voltage Vpe is rapidly decreased to zero. In contrast, the DC voltage Vrc is gradually decreased in association with the supply of the power to the load, which is in the idle state.

(Pressure Keeping Period T20)

The pressure keeping period T20 is a period during which certain stress is applied to the piezoelectric element 1 and maintained. For example, during the period T20, the piezoelectric element 1 is pressed against a fixing unit arranged at the other direction side and the piezoelectric element 1 is kept in a state in which the amount of strain generated in the piezoelectric element 1 is substantially constant. FIG. 6 illustrates a state in which, before start of period T20, the power generation voltage Vpe is set to zero by the discharge switch 2 described above and no power is supplied to the load. As described above, during period T20, the DC voltage Vrc gradually decreases to the predetermined threshold voltage Vtl.

At the time t3 when the DC voltage Vrc reaches Vtl, the load switch control circuit 5 varies the load switch control signal S6 from the high level H to the low level L. This stops the supply of the DC voltage Vrc to the load 7 and the voltage of the output port signal Sp applied to the input node Np is varied from the high level H set by the load 7 to the low level L set by a pull-down resistor (not illustrated).

(Pressure Release Period T30)

Upon release of the application of the pressure to the piezoelectric element 1 at a time t4, the piezoelectric element 1 outputs the negative power generation voltage Vpe, and the rectifier circuit 3 rectifies the negative power generation voltage Vpe and outputs the DC voltage Vrc. At a time t5 when the power generation voltage Vpe reaches the negative threshold voltage Vth and the DC voltage Vrc reaches the (positive) threshold voltage Vth, the value of the DC voltage Vrc and the absolute value of the power generation voltage Vpe start to be decreased due to the current consumption in the load 7. As well as during the pressure application period T10, after the time t5, the load 7 starts the signal transmission process. At a time t6 when the process is completed, the load 7 supplies the output port signal Sp to the input node Np.

The discharge switch 2 serves as a short circuit between the first signal line Tpe1 and the second signal line Tpe2 in response to the output port signal Sp and, after the time t6, the value of the power generation voltage Vpe rapidly reaches zero. A time period T3 and a time period T4 correspond to a time period T1 and a time period T2, respectively. A duplicated description of the time period T3 and the time period T4 is omitted herein.

As described above, with the piezoelectric power generation module 100, the power supply voltage is capable of being supplied to the load 7 connected between the output node N1 and the output node N2 of the piezoelectric power generation module 100 during both the pressure application period and the pressure release period of the piezoelectric element 1.

Figure 7:
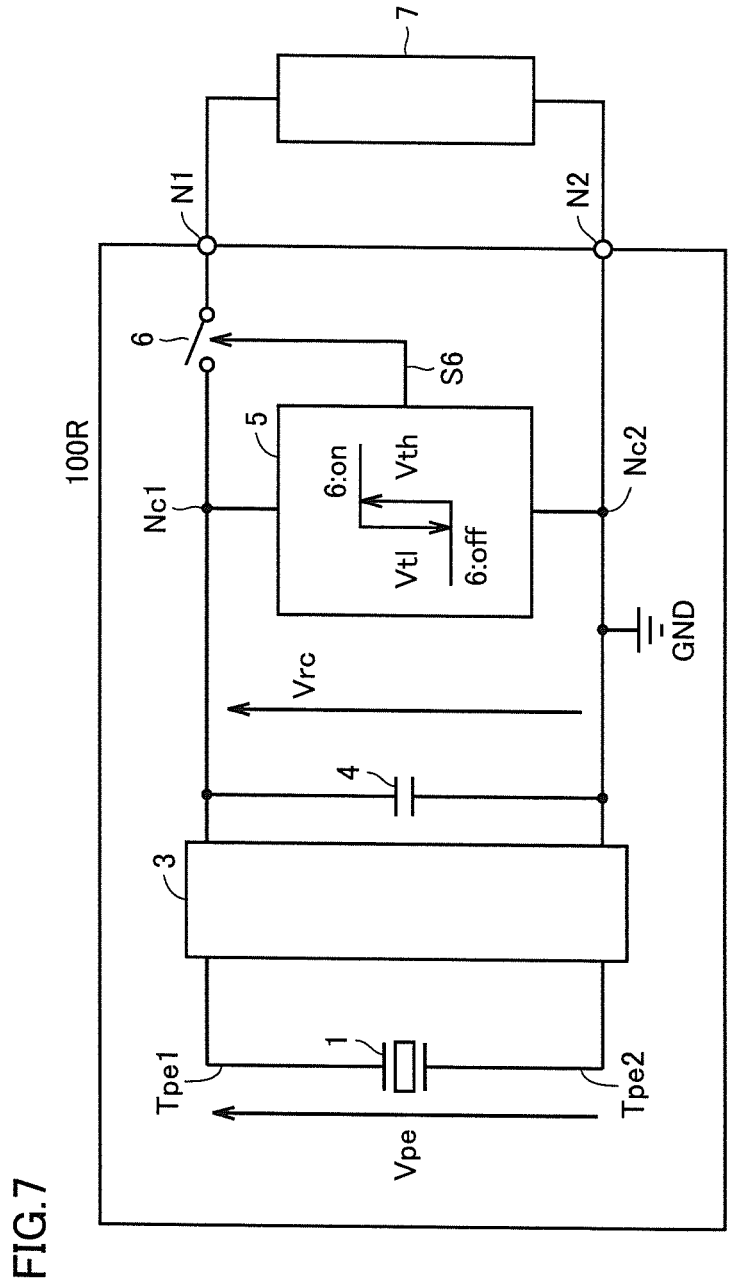
FIG. 7 is a circuit diagram of a piezoelectric power generation module according to a comparative example.

FIG. 7 is a circuit diagram of the piezoelectric power generation module 100R according to the comparative example of the piezoelectric power generation module 100 in FIG. 1.

The same reference numerals are used in FIG. 7 to identify the same components or functions illustrated in FIG. 1. A duplicated description of such components and functions is omitted herein. The piezoelectric power generation module 100R in FIG. 7 is the comparative example for describing the advantages of the piezoelectric power generation module 100 in FIG. 1. The piezoelectric power generation module 100R has a configuration in which the discharge switch 2, the input node Np, and the output port signal Sp are removed from the piezoelectric power generation module 100 in FIG. 1. In other words, in the piezoelectric power generation module 100R, the discharge of the piezoelectric element 1 is not performed after the processing operation by the load 7 is completed.

Figure 8:
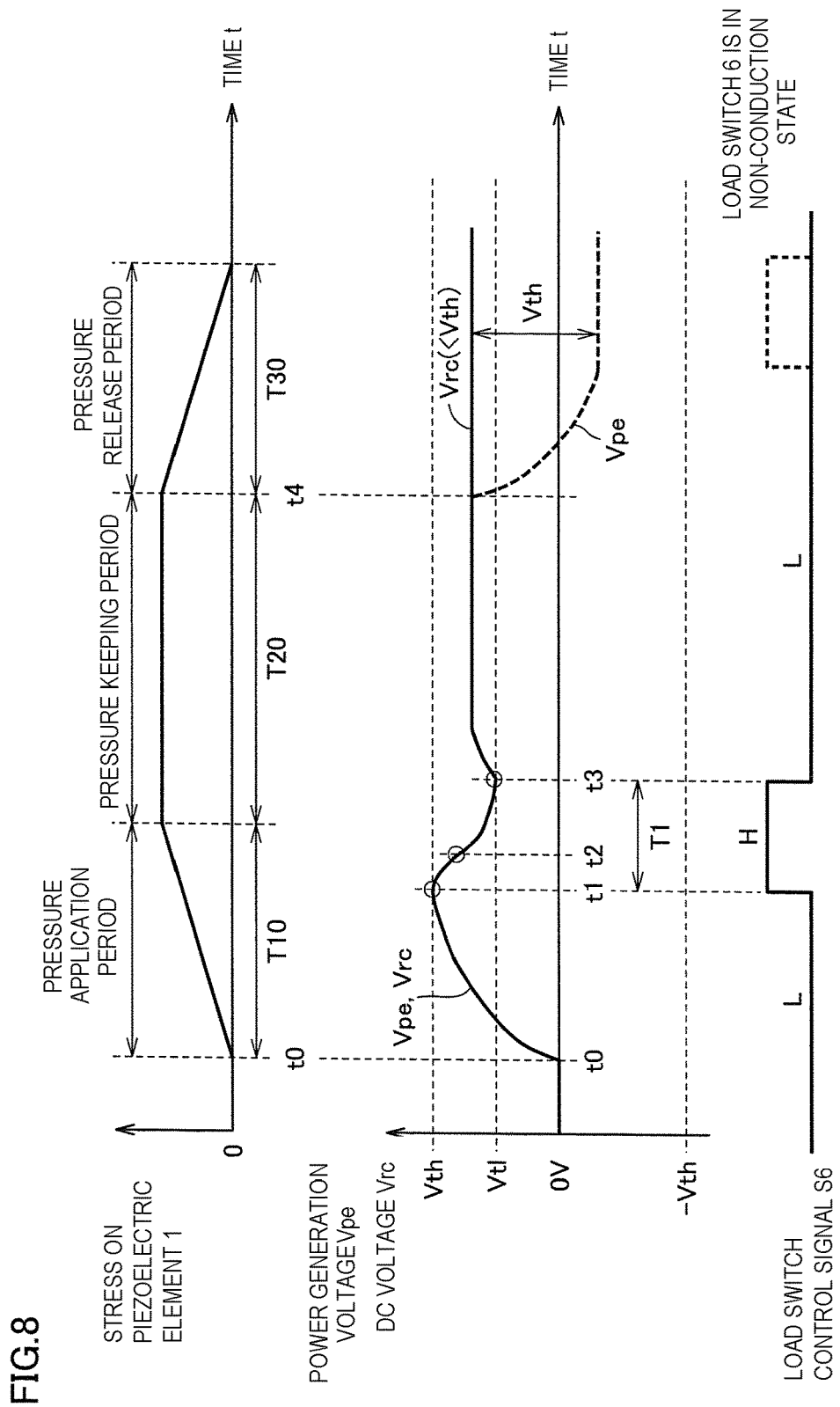
FIG. 8 is a timing chart describing an operation of the piezoelectric power generation module according to the comparative example.

FIG. 8 is a timing chart describing an operation of the piezoelectric power generation module 100R in FIG. 7.

The operation of the piezoelectric power generation module 100R will now be described with reference to FIG. 8 and FIG. 7.

(Pressure Application Period T10)

Referring to FIG. 8, the waveform of the DC voltage Vrc during the time period from the time t0 to the time t3 is the same as the waveform of the DC voltage Vrc during the same time period in FIG. 6. In other words, at start of application of pressure to the piezoelectric element 1 at the time t0, both of the values of the power generation voltage Vpe and the DC voltage Vrc reach the threshold voltage Vth at the time t1. After the time t1, the load 7 enters the idle state after performing the signal transmission process. At the time t3, the value of the DC voltage Vrc reaches the threshold voltage Vtl.

Referring to FIG. 6, after the time t2, the power generation voltage Vpe is rapidly decreased to zero with the discharge switch 2 set in the conduction state. In contrast, referring to FIG. 8, after the time t2, the waveform of the power generation voltage Vpe is the same as the waveform of the DC voltage Vrc. This is because the piezoelectric power generation module 100R does not include the discharge switch 2, which discharges the piezoelectric element 1.

(Pressure Keeping Period T20)

In addition, referring to FIG. 6, after the time t2, the value of the power generation voltage Vpe, which has been decreased to zero, is kept at zero until the time t4 when the application of the pressure to the piezoelectric element 1 is released. In contrast, referring to FIG. 8, after the time t3, the values of the power generation voltage Vpe and the DC voltage Vrc are kept at a voltage value slightly higher than the threshold voltage Vtl. This is because the power generation voltage Vpe generated by the piezoelectric element 1 is applied to the smoothing capacitor 4 via the rectifier circuit 3 during the period T20.

(Pressure Release Period T30)

At the time t4 when the application of the pressure to the piezoelectric element 1 is released, the piezoelectric element 1 starts to output the negative power generation voltage Vpe from the state in which the piezoelectric element 1 keeps the positive power generation voltage Vpe slightly higher than the threshold voltage Vtl and the voltage corresponding to the threshold voltage Vth is generated in the second signal line Tpe2. However, since a voltage value slightly higher than the threshold voltage Vtl is generated in the second signal line Tpe2 at the time t4, the negative power generation voltage Vpe of the piezoelectric element 1, which is supplied to the rectifier circuit 3, is slightly lower than zero.

Accordingly, the piezoelectric element 1 is not capable of charging the smoothing capacitor 4 that has been charged to a voltage higher than or equal to the threshold voltage Vtl and the value of the DC voltage Vrc does not reach the threshold voltage Vth. As a result, the cut-off state of the load switch 6 is kept and the load 7 is not capable of performing the signal transmission process.

The advantages of the piezoelectric power generation module 100 according to the first embodiment will now be described.

In the piezoelectric power generation module 100, the rectifier circuit 3 rectifies the positive power generation voltage Vpe generated in response to the application of the pressure to the piezoelectric element 1 and outputs the DC voltage Vrc during the pressure application period T10. When the value of the DC voltage Vrc exceeds the threshold voltage Vth, the load switch 6 is set to the conduction state and supply of the DC voltage Vrc to the load 7 is started. After the processing operation by the load 7 is completed, the discharge switch 2 connected in parallel to the piezoelectric element 1 serves as a short circuit between the first signal line Tpe1 and the second signal line Tpe2 in response to the output port signal Sp output from the load 7 and the value of the power generation voltage Vpe of the piezoelectric element 1 is reset to zero.

Then, the rectifier circuit 3 rectifies the negative power generation voltage Vpe generated in response to release of the application of the pressure to the piezoelectric element 1 and outputs the DC voltage Vrc during the pressure release period T30. Since the power generation voltage Vpe of the piezoelectric element 1 is reset to zero by the discharge switch 2 before the piezoelectric element 1 generates the negative power generation voltage Vpe, the value of the power generation voltage Vpe output from the piezoelectric element 1 is increased to the threshold voltage Vth necessary for operating the load 7, as well as during the pressure application period T10.

Accordingly, the load 7 is capable of performing a desired processing operation also during the pressure release period T30, as well as during the pressure application period T10. For example, dimmer control of a lighting switch and opening-closing control of a blind are capable of being performed with one series of the pressure application operation and the pressure release operation to the piezoelectric element 1.

<Modification of First Embodiment>

Figure 3:
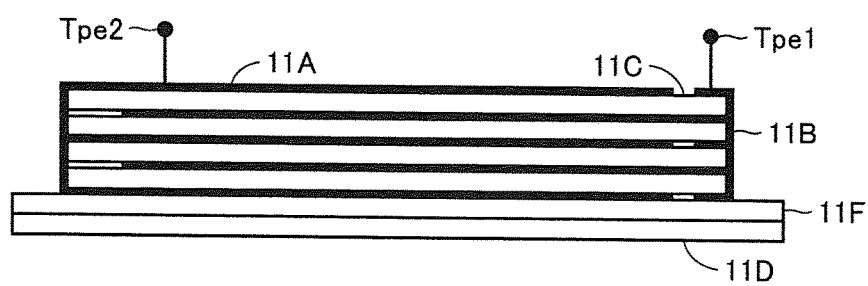
FIG. 3 is a cross-sectional view of a piezoelectric element according to a modification of the first embodiment.

FIG. 3 is a cross-sectional view of a piezoelectric element 11 according to another example of the piezoelectric element 1 in FIG. 2.

The same reference numerals are used in FIG. 3 to identify the same components or functions illustrated in FIG. 2. A duplicated description of such components and functions is omitted herein, except it is noted that first electrode 11A corresponds to electrode 1A in FIG. 2, second electrode 11B corresponds to electrode 1B in FIG. 2, and metal plate 11D corresponds to plate 1D in FIG. 2. Moreover, according to the exemplary embodiment 11F can be an insulating layer, for example, that is disposed between the piezoelectric body and the metal plate. Referring specifically to FIG. 3, the piezoelectric element 11 has a structure in which piezoelectric bodies 11C are laminated so that electric charges having the same polarity are generated on the faces which the respective piezoelectric bodies 11C oppose during application of pressure. The laminating structure of the piezoelectric element 11 increases the amount of electric charge generated by the piezoelectric element 11 to allow the load 7 (refer to FIG. 1) to be driven for a longer time period.

Second Embodiment

Figure 9:
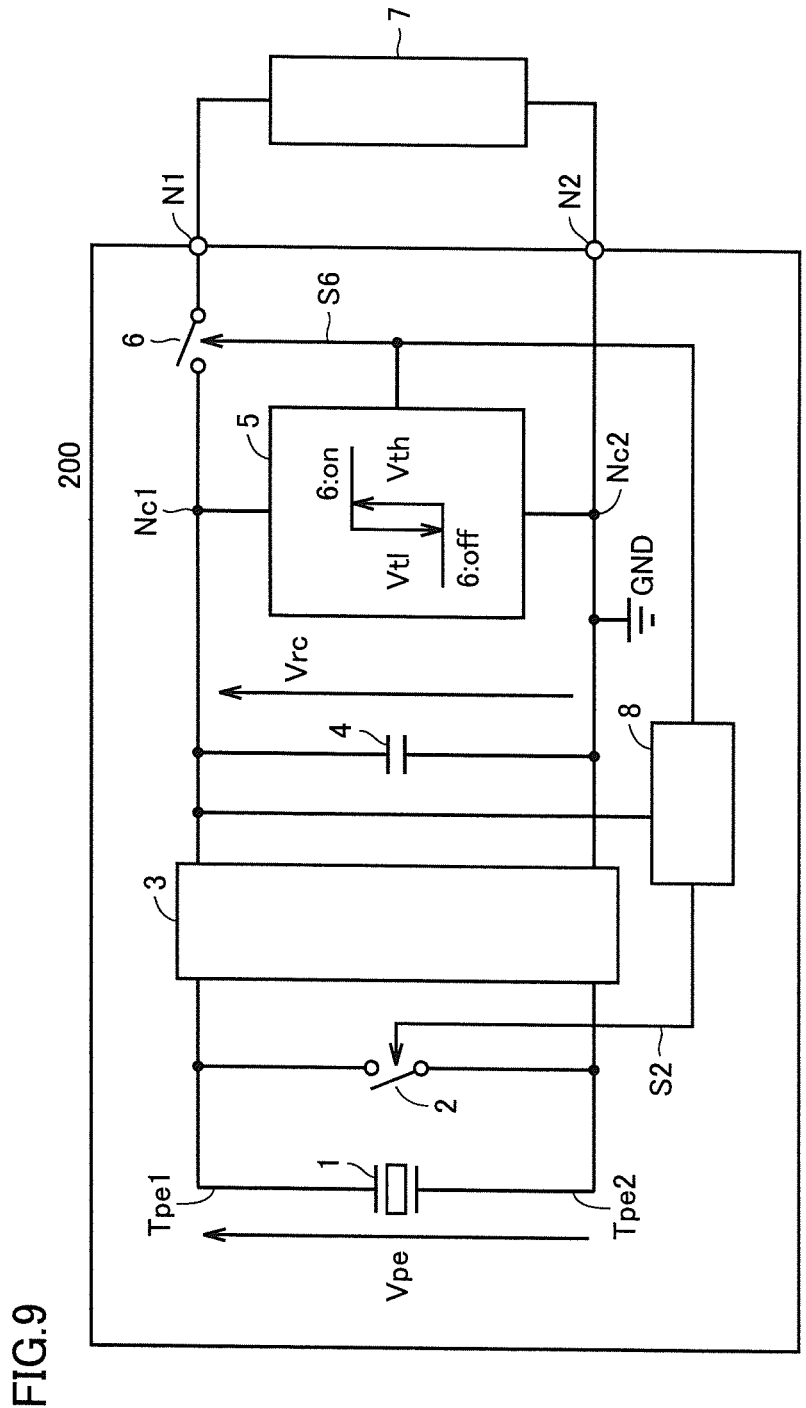
FIG. 9 is a circuit diagram of a piezoelectric power generation module according to a second embodiment.

FIG. 9 is a circuit diagram of a piezoelectric power generation module 200 according to a second embodiment.

The same reference numerals are used in FIG. 9 to identify the same components or functions illustrated in FIG. 1. A duplicated description of such components and functions is omitted herein. In the piezoelectric power generation module 200 illustrated in FIG. 9, control of the conduction state of the discharge switch 2 is performed on the basis of a discharge switch control signal S2 output from a discharge switch control circuit 8, instead of the output port signal Sp output from the load 7. Accordingly, the piezoelectric power generation module 200 does not include the input node Np provided in the piezoelectric power generation module 100 in FIG. 1.

The discharge switch control circuit 8 operates upon reception of the DC voltage Vrc supplied from the rectifier circuit 3 and outputs a one-shot pulse having a certain pulse width as the discharge switch control signal S2 in response to a falling edge of the load switch control signal S6. The discharge switch 2 is set to the conduction state during a time period when the discharge switch control signal S2 is set to the high level to make a short circuit between the first signal line Tpe1 and the second signal line Tpe2.

Figure 10:
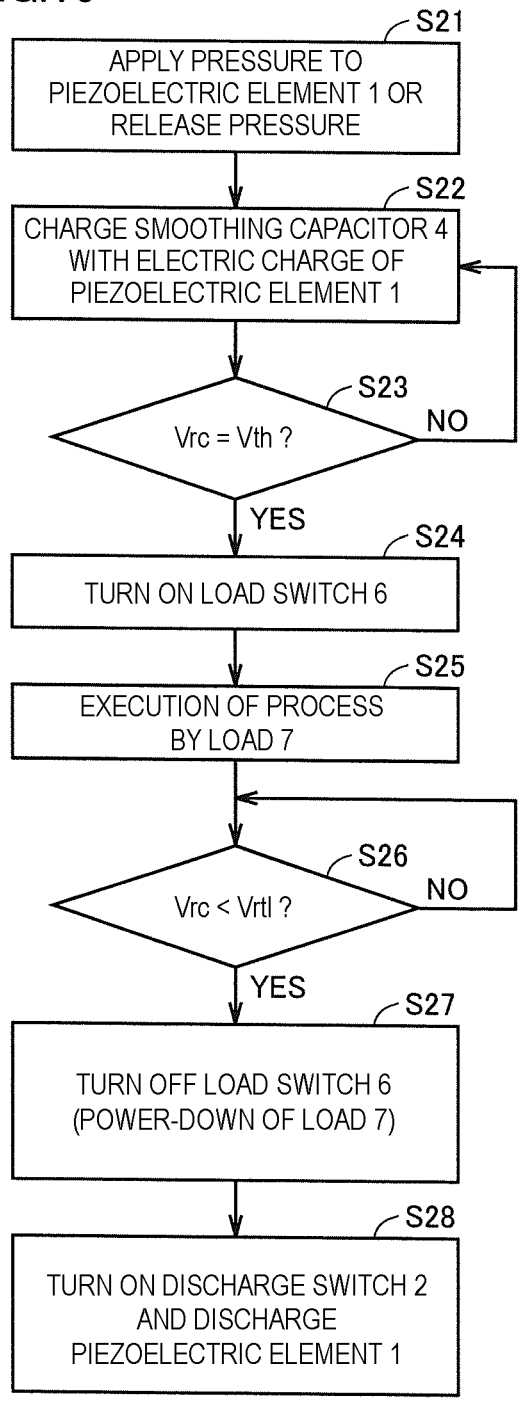
FIG. 10 is a flowchart illustrating a processing flow of the piezoelectric power generation module according to the second embodiment.

FIG. 10 is a flowchart illustrating a processing flow of the piezoelectric power generation module 200 in FIG. 9.

The processing flow of the piezoelectric power generation module 200 will now be descried with reference to FIG. 10 and FIG. 9. Steps S21 to S25 are the same as Steps S11 to S15 illustrated in FIG. 5.

Upon application of pressure to the piezoelectric element 1 (upon generation of the positive power generation voltage Vpe) or upon release of application of pressure to the piezoelectric element 1 (upon generation of the negative power generation voltage Vpe), the power generation voltage Vpe is applied between the terminals of the input terminal pair of the rectifier circuit 3 (Step S21). The power generation voltage Vpe rectified by the rectifier circuit 3 is smoothed by the smoothing capacitor 4 to generate the DC voltage Vrc (Step S22). The load switch control circuit 5 determines whether the value of the DC voltage Vrc that is applied reaches the threshold voltage Vth (Step S23).

If the value of the DC voltage Vrc is lower than the threshold voltage Vth ("NO" in Step S23), the load switch 6 is set to the cut-off state and the rectifier circuit 3 continuously charges the smoothing capacitor 4. If the value of the DC voltage Vrc reaches the threshold voltage Vth ("YES" in Step S23), the load switch control circuit 5 sets the load switch 6 to the conduction state using the load switch control signal S6 (Step S24).

The DC voltage Vrc is supplied to the load 7 via the load switch 6 and the output node N1. The load 7 performs the signal transmission process to an electronic device (Step S25). The load switch control circuit 5 compares the value of the DC voltage Vrc that is applied with the threshold voltage Vtl (Step S26). If the value of the DC voltage Vrc is higher than or equal to the threshold voltage Vtl ("NO" in Step S26), the conduction state of the load switch 6 is kept. If the value of the DC voltage Vrc is lower than the threshold voltage Vtl ("YES" in Step S26), the load switch control circuit 5 sets the load switch 6 to the cut-off state using the load switch control signal S6 (Step S27).

After the load switch 6 is set to the cut-off state, the discharge switch control circuit 8 generates a one-shot pulse as the discharge switch control signal S2, sets the discharge switch 2 to the conduction state during a certain time period, and discharge the electric charge in the piezoelectric element 1 (Step S28). This discharge resets the value of the power generation voltage Vpe of the piezoelectric element 1 to zero.

Figure 11:
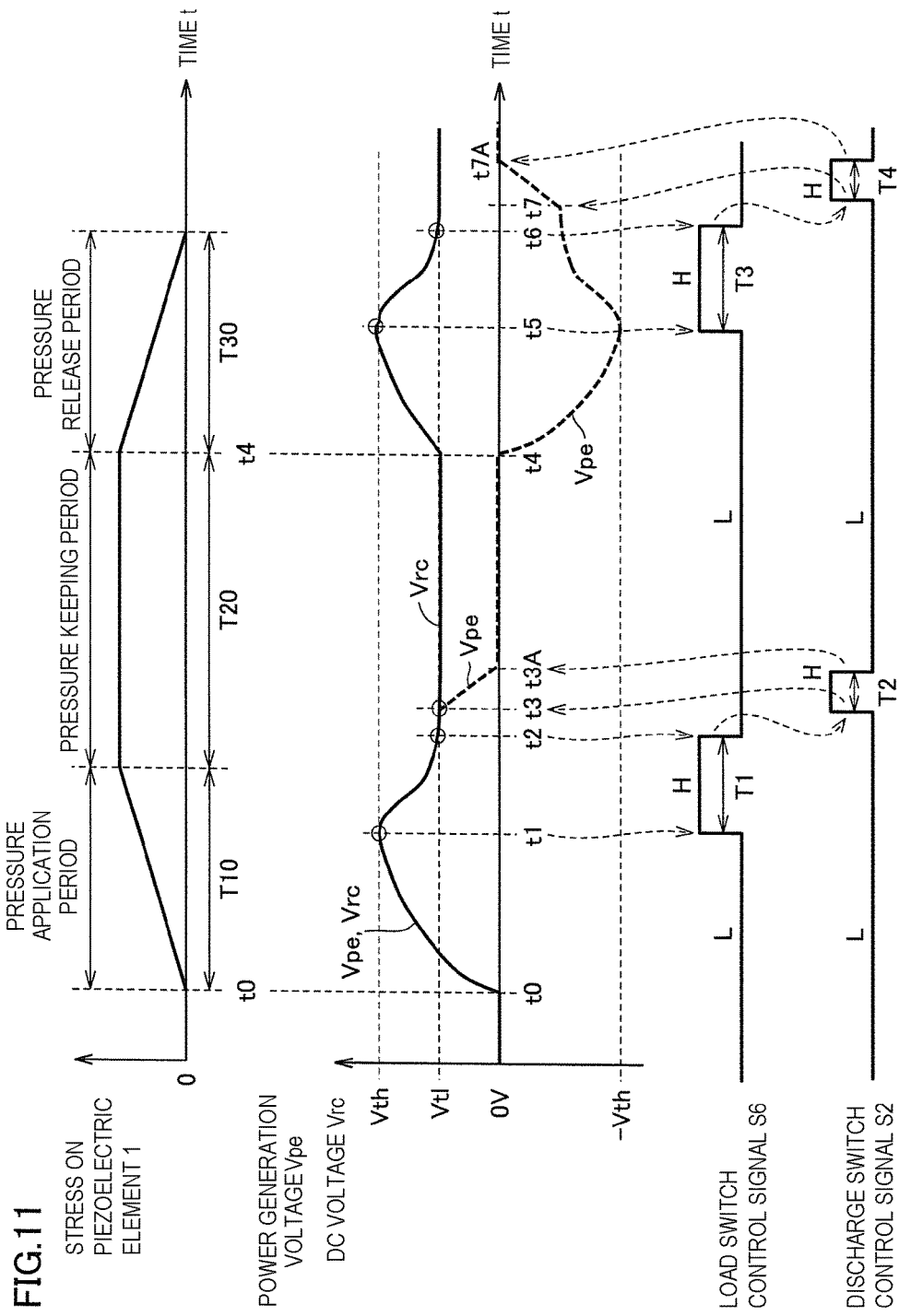
FIG. 11 is a timing chart describing an operation of the piezoelectric power generation module according to the second embodiment.

FIG. 11 is a timing chart describing an operation of the piezoelectric power generation module 200 in FIG. 9.

The operation of the piezoelectric power generation module 200 will now be described with reference to FIG. 11 and FIG. 9. Referring to FIG. 11, the horizontal axis represents time and the vertical axis schematically represents voltage waveforms including the power generation voltage Vpe and signal waveforms.

At start of application of pressure to the piezoelectric element 1 at the time t0, the DC voltage Vrc output from the rectifier circuit 3 is also increased with the increase in the power generation voltage Vpe generated by the piezoelectric element 1. During the pressure application period to the piezoelectric element 1, which is started at the time t0, the piezoelectric element 1 outputs the positive power generation voltage Vpe and the values of the power generation voltage Vpe and the DC voltage Vrc reach the threshold voltage Vth at the time t1.

When the value of the DC voltage Vrc reaches the threshold voltage Vth, the load switch control circuit 5 varies the logical level of the load switch control signal S6 from the low level to the high level. In response to the variation in the load switch control signal S6, the load switch 6 is set to the conduction state and the piezoelectric power generation module 200 starts supply of the DC voltage Vrc to the load 7.

After the time t1, the load 7 consumes the electric charge accumulated in the smoothing capacitor 4 to perform the signal transmission process to an electronic device. At the time t2 when the value of the DC voltage Vrc reaches the threshold voltage Vtl, the load switch control circuit 5 varies the load switch control signal S6 from the high level H to the low level L to set the load switch 6 to the cut-off state and stops the supply of the DC voltage Vrc to the load 7. During the time period from the time t0 to the time t2, the values of the DC voltage Vrc and the power generation voltage Vpe are varied in the same manner.

In response to the variation in the logical level of the load switch control signal S6 at the time t2, the discharge switch control circuit 8 generates a one-shot pulse having a pulse width corresponding to the time period T2 from the time t3 to a time t3A as the discharge switch control signal S2. The discharge switch 2 serves as a short-circuit between the first signal line Tpe1 and the second signal line Tpe2 during the time period T2 in response to the discharge switch control signal S2. As a result, the value of the power generation voltage Vpe is rapidly decreased from the threshold voltage Vtl at the time t3 to zero at the time t3A. Until the time t4 when the pressure release period T30 is started, the value of the DC voltage Vrc is kept at the threshold voltage Vtl and the value of the power generation voltage Vpe is kept at zero.

At the time t4 when the application of the pressure to the piezoelectric element 1 is released, the piezoelectric element 1 outputs the negative power generation voltage Vpe, and the rectifier circuit 3 rectifies the negative power generation voltage Vpe to charge the smoothing capacitor 4 and outputs the DC voltage Vrc. At the time t5 when the DC voltage Vrc reaches the threshold voltage Vth and the power generation voltage Vpe reaches the negative threshold voltage Vth (−Vth), the value of the DC voltage Vrc and the absolute value of the power generation voltage Vpe start to be decreased due to the current consumption in the load 7.

As well as after the time t1, after the time t5, the load 7 starts the signal transmission process. At the time t6 when the DC voltage Vrc reaches the threshold voltage Vtl, the logical level of the load switch control signal S6 is varied from the high level H to the low level L. In response to the variation in the load switch control signal S6, the discharge switch control circuit 8 generates a one-shot pulse having a pulse width corresponding to the time period T4 as the discharge switch control signal S2. In response to the discharge switch control signal S2, the discharge switch 2 serves as a short circuit between the first signal line Tpe1 and the second signal line Tpe2. After a time t7, the value of the power generation voltage Vpe is rapidly increased to zero.

With the piezoelectric power generation module 200, control of the discharge switch 2 with the load 7 is not required and the discharge switch 2 is capable of being controlled on the basis of the value of the DC voltage Vrc output from the rectifier circuit 3 provided in the piezoelectric power generation module 200. Accordingly, necessary power supply voltage is capable of being supplied also to the load 7 that does not have the output function of the output port signal in both the operation to apply pressure to the piezoelectric element 1 and the operation to release the application of the pressure to the piezoelectric element 1.

Although the piezoelectric element is made of PZT ceramics in the above embodiments, the piezoelectric element is not limited to this. For example, the piezoelectric element may be made of a non-lead based piezoelectric ceramic material, such as potassium-sodium niobate-based ceramics or alkali niobate based ceramics.

Although the piezoelectric element 1 is supported by the two supports 1E in the above embodiments, the supporting structure of the piezoelectric element 1 is not limited to this. For example, the piezoelectric element 1 may have a structure in which one end portion of the piezoelectric element 1 is supported by a cantilever and stress is applied to the other end portion, which is a free end. Alternatively, the piezoelectric element 1 may have a bar shape in which one end portion of the piezoelectric element 1 is supported by a cantilever and stress is applied to the other end portion. In other words, any supporting mode may be used as long as the piezoelectric element 1 is capable of being deformed in response to application of pressure.

While the present disclosure has been described with reference to what are presently considered to be the exemplary embodiments, it is to be understood that the invention is not limited to the disclosed embodiments. On the contrary, the invention is intended to cover various modifications and equivalent arrangements included within the spirit and scope of the appended claims. The scope of the following claims is to be accorded the broadest interpretation so as to encompass all such modifications and equivalent structures and functions.

REFERENCE SIGNS LIST 1 piezoelectric element
1A, 1B electrode
1C piezoelectric body
1D metal plate
1E supports
2 discharge switch
3 rectifier circuit
4 smoothing capacitor
5 load switch control circuit
6 load switch
7 load
8 discharge switch control circuit
11 piezoelectric element
11C piezoelectric bodies
51 switch
52 comparator circuit
53 comparison voltage generating circuit
100, 100R, 200 piezoelectric power generation module
N1, N2 output node
Nc1, Nc2 power supply node
Np input node
R1, R2, R3 resistor
S2 discharge switch control signal
S6 load switch control signal
Sp output port signal
Tpe1 first signal line
Tpe2 second signal line
Vpe power generation voltage
Vrc DC voltage
Vth, Vtl threshold voltage

The invention claimed is:

1. A power generation device comprising:
a piezoelectric element;
a discharge mechanism connected in parallel to the piezoelectric element;
a rectifier circuit including input terminals connected to the piezoelectric element and output terminals that output a direct-current voltage;
a switch control circuit including first and second input terminals respectively connected to the output terminals of the rectifier circuit, and an output terminal that outputs a switch control signal;
a capacitive element connected in parallel to the first and second input terminals of the switch control circuit; and
a switch that is connected to the output terminal of the rectifier circuit and that switches between a conductive state and an off state based on the switch control signal,
wherein a control signal sets the discharge mechanism to a conductive state after the switch is set to the conductive state.

2. The power generation device according to claim 1, further comprising:
a load coupled to the output terminals of the rectifier circuit when the switch is in the conductive state,
wherein the load is configured to generate the control signal to set the discharge mechanism to the conductive state after the load performs an operation.

3. The power generation device according to claim 1, wherein an electrostatic capacity of the piezoelectric element is greater than or equal to an electrostatic capacity of the capacitive element.

4. The power generation device according to claim 1, wherein the discharge mechanism is an electronic switch.

5. The power generation device according to claim 1, wherein the discharge mechanism switches between the conductive state and an off state based on the control signal that is generated by a load.

6. The power generation device according to claim 1, further comprising:
a control circuit coupled between the output terminal of the switch control circuit and the discharge mechanism and configured to generate the control signal,
wherein the discharge mechanism switches between the conductive state and an off state based on the control signal generated by the control circuit in response to the conductive state of the first switch.

7. The power generation device according to claim 1, wherein the piezoelectric element is configured to generate a voltage that is supplied to the rectifier circuit when pressure is applied to or released from the piezoelectric element.

8. The power generation device according to claim 7, wherein the piezoelectric element comprises a piezoelectric body, a metal plate and a pair of electrodes disposed on opposing sides of the piezoelectric body.

9. The power generation device according to claim 7, wherein the switch control circuit compares a rectified voltage output by the rectifier circuit with a threshold voltage and controls the switch to the conductive state, via the switch control signal, when the rectified voltage is greater than the threshold voltage.

10. The power generation device according to claim 9, wherein, when the switch is in the conductive state, the switch control circuit compares a rectified voltage output by the rectifier circuit with an additional threshold voltage lower than the threshold voltage and controls the switch to the off state, via the switch control signal, when the rectified voltage is equal to or less than the additional threshold voltage.

11. The power generation device according to claim 9, wherein the switch control circuit comprises:
first, second and third resistors connected in series between the first and second input terminals;
an additional switch coupled to the first input terminal and a node between the first and second resistors; and
a comparator have a non-inverting input coupled to a node between the second and third resistors, an inverting input coupled to the voltage threshold, and an output coupled to the output terminal of the switch control circuit.

12. The power generation device according to claim 11, wherein the output of the comparator is further coupled to the additional switch to control a state of the additional switch between a conductive state and an off state.

13. A remote controller comprising:
the piezoelectric power generation device according to claim 1; and
a radio-frequency circuit configured to perform a process upon supply of the direct-current voltage from the switch to the radio-frequency circuit, and
wherein, after the process is complete, the radio-frequency circuit generates the control signal that sets the discharge mechanism to the conductive state.

14. A power generation module comprising:
a piezoelectric element;
a discharge mechanism connected in parallel to the piezoelectric element;
a rectifier circuit including input terminals connected to the piezoelectric element and output terminals that output a direct-current voltage;
a switch control circuit including first and second input terminals respectively connected to the output terminals of the rectifier circuit, and an output terminal that outputs a switch control signal;
a capacitive element connected in parallel to the first and second input terminals of the switch control circuit;
a switch that is connected to the output terminal of the rectifier circuit and that switches between a conductive state and an off state based on the switch control signal; and
a load coupled to the output terminals of the rectifier circuit when the switch is in the conductive state, the load being configured to generate a control signal to set the discharge mechanism to a conductive state after the switch is set to the conductive state.

15. The power generation module according to claim 14, wherein the load is configured to perform a process upon supply of the direct-current voltage from the switch, and, after the process is complete, generate the control signal to set the discharge mechanism to the conductive state.

16. The power generation module according to claim 15, wherein the discharge mechanism switches between the conductive state and an off state based on the control signal that is generated by the load.

17. The power generation module according to claim 14, wherein the piezoelectric element is configured to generate a voltage that is supplied to the rectifier circuit when pressure is applied to or released from the piezoelectric element.

18. The power generation module according to claim 17, wherein the switch control circuit compares a rectified voltage output by the rectifier circuit with a threshold voltage and controls the switch to the conductive state, via the switch control signal, when the rectified voltage is greater than the threshold voltage.

19. The power generation module according to claim 18, wherein, when the switch is in the conductive state, the switch control circuit compares a rectified voltage output by the rectifier circuit with an additional threshold voltage lower than the threshold voltage and controls the switch to the off state, via the switch control signal, when the rectified voltage is equal to or less than the additional threshold voltage.

20. The power generation module according to claim 19, wherein the switch control circuit comprises:
first, second and third resistors connected in series between the first and second input terminals;
an additional switch coupled to the first input terminal and a node between the first and second resistors; and
a comparator have a non-inverting input coupled to a node between the second and third resistors, an inverting input coupled to the voltage threshold, and an output coupled to the output terminal of the switch control circuit,
wherein the output of the comparator is further coupled to the additional switch to control a state of the additional switch between a conductive state and an off state.

* * * * *